(12) United States Patent
Takahashi et al.

(10) Patent No.: US 8,766,589 B2
(45) Date of Patent: Jul. 1, 2014

(54) MOTOR CONTROL UNIT AND VEHICLE STEERING SYSTEM

(75) Inventors: Toshihiro Takahashi, Nishio (JP); Satoru Mikamo, Okazaki (JP); Hiroshi Kawamura, Okazaki (JP); Jun Hasegawa, Okazaki (JP); Akihiro Tomita, Okazaki (JP); Akira Nambu, Okazaki (JP)

(73) Assignee: JTEKT Corporation, Osaka-Shi (JP)

( * ) Notice: Subject to any disclaimer, the term of this patent is extended or adjusted under 35 U.S.C. 154(b) by 104 days.

(21) Appl. No.: 13/450,992

(22) Filed: Apr. 19, 2012

(65) Prior Publication Data

US 2012/0274260 A1  Nov. 1, 2012

(30) Foreign Application Priority Data

Apr. 28, 2011 (JP) ................................ 2011-100897

(51) Int. Cl.
*H02P 21/00* (2006.01)

(52) U.S. Cl.
USPC .......... 318/823; 318/802; 318/799; 318/800; 318/805; 318/400.02

(58) Field of Classification Search
USPC ................. 318/400.02; 361/23; 701/41, 143
See application file for complete search history.

(56) References Cited

U.S. PATENT DOCUMENTS

| 7,586,285 | B2 * | 9/2009 | Gunji | 318/717 |
| 7,626,838 | B2 * | 12/2009 | Gunji | 363/56.04 |
| 7,667,941 | B2 * | 2/2010 | Kawashima | 361/93.1 |
| 8,013,564 | B2 * | 9/2011 | Gunji | 318/801 |
| 2003/0058589 | A1 | 3/2003 | Matsumoto et al. | |
| 2003/0117097 | A1 * | 6/2003 | Iwata et al. | 318/432 |
| 2008/0035411 | A1 | 2/2008 | Yamashita et al. | |
| 2009/0073617 | A1 * | 3/2009 | Gunji | 361/23 |

FOREIGN PATENT DOCUMENTS

| JP | A-7-154901 | | 6/1995 |
| JP | A-11-8992 | | 1/1999 |
| JP | 2001037242 A | * | 2/2001 |
| JP | A-2001-268986 | | 9/2001 |
| JP | A-2003-79173 | | 3/2003 |
| JP | 2006256550 A | * | 9/2006 |
| JP | A-2006-256550 | | 9/2006 |
| JP | A-2007-244028 | | 9/2007 |
| JP | A-2008-37399 | | 2/2008 |
| JP | A-2011-51537 | | 3/2011 |

* cited by examiner

*Primary Examiner* — Eduardo Colon Santana
*Assistant Examiner* — Bickey Dhakal
(74) *Attorney, Agent, or Firm* — Oliff PLC

(57) ABSTRACT

In a motor control unit, a current-carrying failure detection unit determines a first determination condition and a second determination condition. The current-carrying failure detection unit measures a duration of a state where the first determination condition is satisfied, and a duration of a state where the second determination condition is satisfied. When the first or second duration exceeds a predetermined reference period, the current-carrying failure detection unit determines that a current-carrying failure has occurred.

9 Claims, 8 Drawing Sheets

F I G. 7A
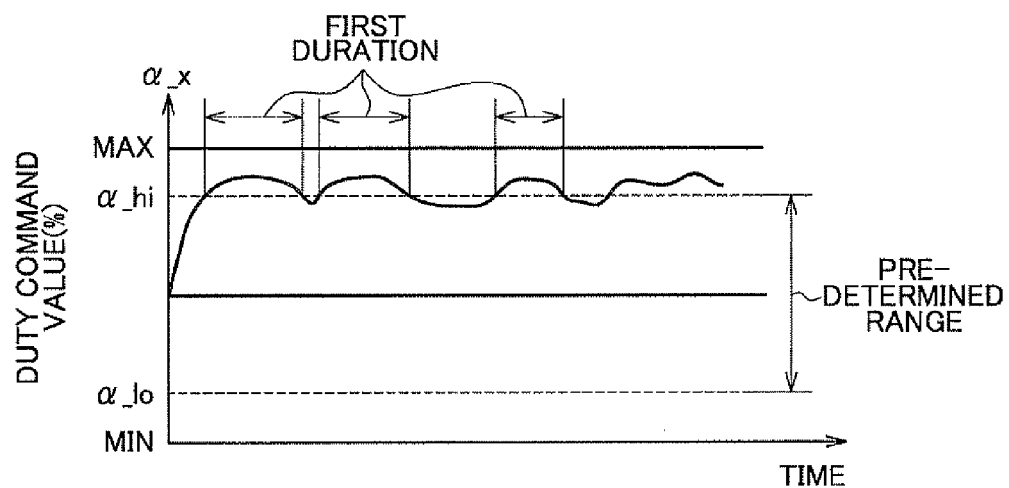
F I G. 7B
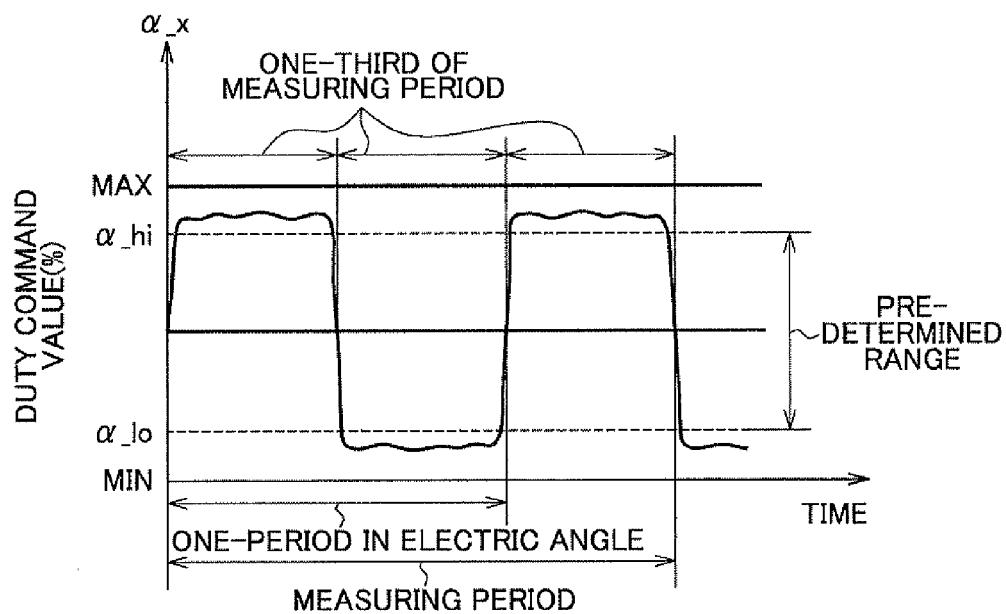

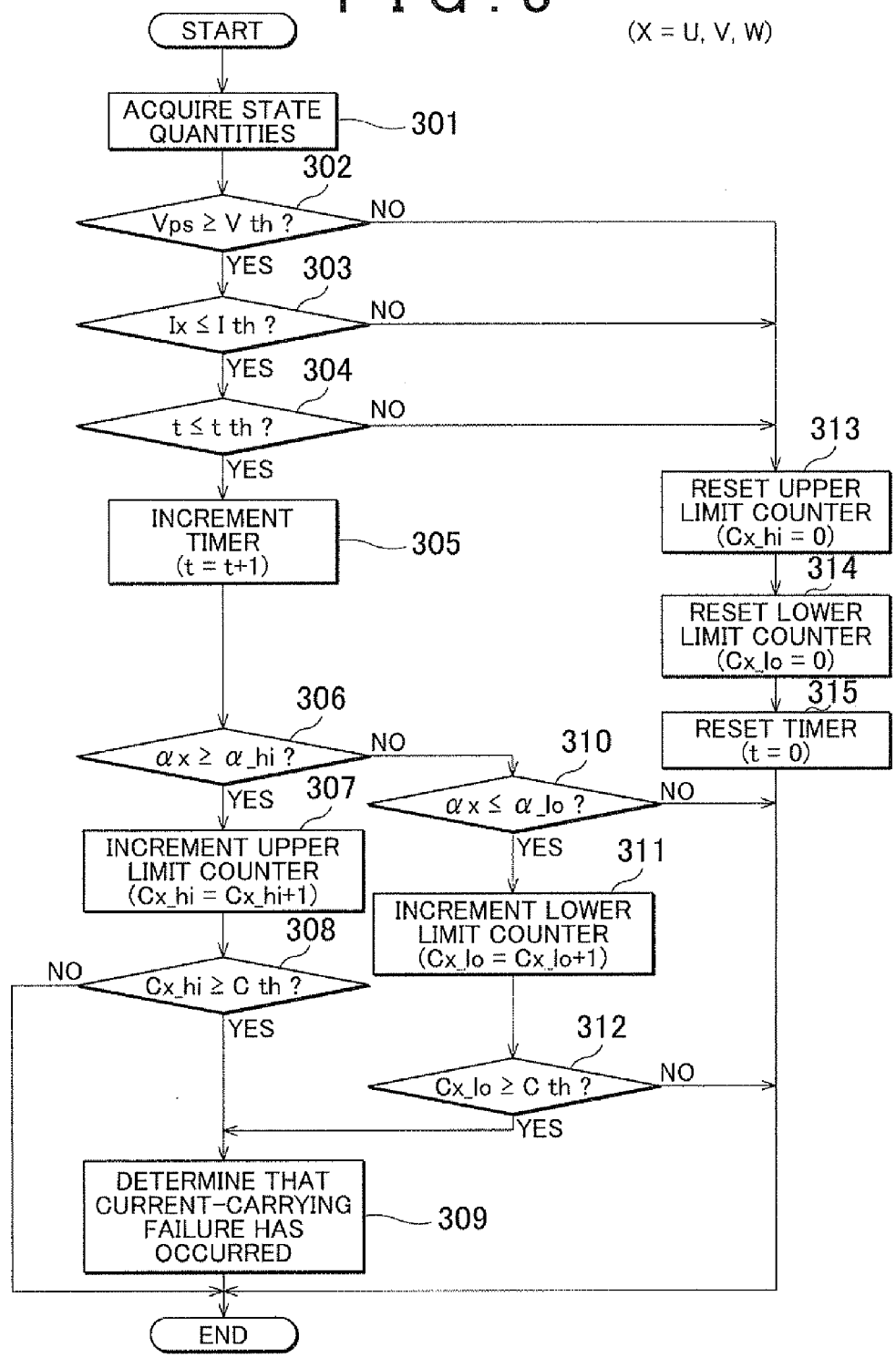

MOTOR CONTROL UNIT AND VEHICLE STEERING SYSTEM

INCORPORATION BY REFERENCE

The disclosure of Japanese Patent Application No. 2011-100897 filed on Apr. 28, 2011 including the specification, drawings and abstract, is incorporated herein by reference in its entirety.

BACKGROUND OF THE INVENTION

1. Field of the Invention

The invention relates to a motor control unit and a vehicle steering system.

2. Description of Related Art

A motor control unit that controls a brushless motor used in, for example, a vehicle steering system has the function of detecting a current-carrying failure, such as a wire disconnection, in an electric power supply path to the motor. Generally, such a current-carrying failure is detected in the following manner. First, an attempt to apply electric current to the motor is made. Then, if a detected actual current value indicates a non-current carrying state despite the attempt to apply electric current to the motor, it is determined that a current-carrying failure has occurred. Whether an attempt to apply electric current to the motor is being made is determined based on, for example, a current command value or a voltage command value (DUTY command value).

However, even when no current-carrying failure has occurred, if the motor is rotating at a high speed, a high inductive voltage is generated, which may prevent application of electric current to the motor. Therefore, according to, for example, Japanese Patent Application Publication No. 2007-244028 (JP 2007-244028 A), a motor rotation angular velocity is added to determination conditions. In this way, it is possible to prevent a problem that an erroneous determination that a current-carrying failure has occurred is made although no current-carrying failure has actually occurred during high-speed rotation. Thus, it is possible to improve the detection accuracy.

In many cases, a brushless motor is controlled based on a motor rotation angle detected by a rotation angle sensor (resolver). In recent years, however, there has been proposed a motor control unit that controls a motor based on an estimated motor rotation angle without using a rotation angle sensor, as described in Japanese Patent Application Publication No. 2011-51537 (JP 2011-51537 A). In such a motor control unit that controls the motor without using a rotation angle sensor, a motor rotation angular velocity is estimated based on, for example, an inductive voltage value calculated according to a known motor voltage equation based on phase current values and phase voltage values.

However, in a state where a current-carrying failure has occurred in an electric power supply path, the resistance value of the electric power supply path is infinite in theory. Therefore, it is not possible to calculate an appropriate inductive voltage value. Consequently, it is not possible to estimate a motor rotation angular velocity. Accordingly, in the motor control unit that controls the motor without using a rotation angle sensor, it is not possible to use a motor rotation angular velocity to determine whether a current-carrying failure has occurred. Therefore, it is difficult to improve the accuracy of detecting a current-carrying failure, and there is still room for improvement in the detection accuracy.

SUMMARY OF THE INVENTION

It is an object of the invention to provide a motor control unit with which the above-described problem is solved, and a vehicle steering system that includes the motor control unit.

An aspect of the invention relates to a motor control unit that includes: a motor control signal output unit that outputs a motor control signal; a drive circuit that supplies driving current to a motor based on the motor control signal; and an abnormality detection unit that detects a current-carrying failure in an electric power supply path to the motor based on a voltage parameter corresponding to a voltage that is applied to the motor. The abnormality detection unit determines whether a first determination condition is satisfied. The first determination condition includes a condition that an actual current value that indicates an electric current actually supplied to the motor is smaller than or equal to a predetermined current value that indicates a non-current carrying state and the voltage parameter is higher than or equal to an upper limit of a predetermined range corresponding to the predetermined current value. The abnormality detection unit determines whether a second determination condition is satisfied. The second determination condition includes a condition that the actual current value is smaller than or equal to the predetermined current value and the voltage parameter is lower than or equal to a lower limit of the predetermined range. The abnormality detection unit measures a first duration that is a duration of time that a state where the first determination condition is satisfied continues, and a second duration that is a duration of time that a state where the second determination condition is satisfied continues. When the first duration or the second duration exceeds a predetermined reference period that is set based on a rotation period of the motor when the motor is rotating at such a high speed that the voltage parameter falls outside the predetermined range due to an influence of inductive voltage, the abnormality detection unit determines that a current-carrying failure has occurred.

The value (sign) of the voltage (voltage parameter) that is applied to the motor changes in accordance with the motor rotation angle. Therefore, the duration (first or second duration) of the state where the first or second determination condition is satisfied due to the influence of inductive voltage is determined based on a rotation period of the motor during high-speed rotation. Therefore, when the first or second duration exceeds the reference period that is set based on the rotation period of the motor during high-speed rotation, it is determined that this state has occurred due to a current-carrying failure, not due to the influence of inductive voltage. Therefore, with the above configuration, it is possible to accurately detect a current-carrying failure by preventing an erroneous determination that a current-carrying failure has occurred from being made during high-speed rotation, without adding the motor rotation angular velocity to the determination conditions.

The motor control unit according to the above aspect may be mounted on a vehicle steering system.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 7A is a graph that shows a temporal change in a duty command value that is influenced by, for example, an estimation error of a motor rotation angle under abnormal conditions where a current-carrying failure has occurred;

FIG. 7B is a graph that shows a temporal change in a duty command value that is influenced by, for example, an estimation error of a motor rotation angle while the motor is rotating at a high speed under normal conditions; and FIG. 8 is a flowchart that shows the procedure of current-carrying failure determination executed by a current-carrying failure detection unit according to a second embodiment.

DETAILED DESCRIPTION OF EMBODIMENTS

Hereafter, a first embodiment in which the invention is applied to a vehicle steering system including a steering force assisting device will be described with reference to the accompanying drawings.

Figure 1:
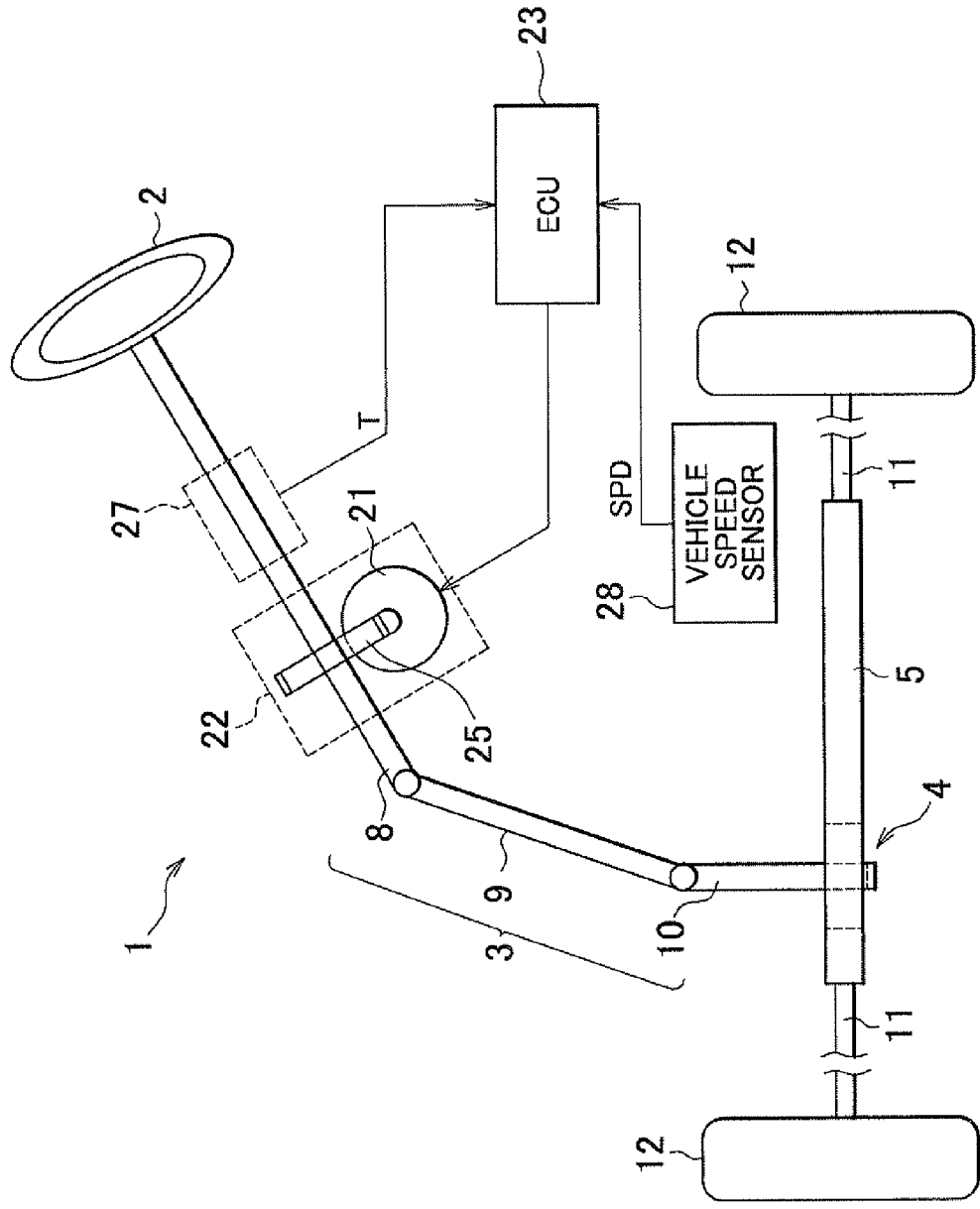
FIG. 1 is a schematic configuration diagram of a vehicle steering system (EPS)

In a vehicle steering system (EPS) 1 shown in FIG. 1, a steering shaft 3 to which a steering wheel 2 is fixed is coupled to a rack shaft 5 via a rack and pinion mechanism 4. The rotation of the steering shaft 3 resulting from a steering operation is converted to a reciprocal linear motion of the rack shaft 5 by the rack and pinion mechanism 4. The steering shaft 3 is formed by coupling a column shaft 8, an intermediate shaft 9, and a pinion shaft 10 to each other. The reciprocal linear motion of the rack shaft 5 resulting from the rotation of the steering shaft 3 is transmitted to knuckles (not shown) via tie rods 11 coupled to respective ends of the rack shaft 5. Thus, the steered angle of steered wheels 12 is changed, that is, the traveling direction of a vehicle is changed.

The EPS 1 includes an EPS actuator 22 and an ECU 23. The EPS actuator 22 serves as a steering force assisting device that applies assist force for assisting a steering operation to a steering system, using a motor 21 as a driving source. The ECU 23 serves as a motor control unit that controls the operation of the EPS actuator 22.

The EPS actuator 22 is configured as a column assist-type EPS actuator. The motor 21 is drivingly-coupled to the column shaft 8 via a reduction mechanism 25 formed of, for example, a worm and a worm wheel (worm & wheel). A brushless motor is employed as the motor 21 in the first embodiment, and is driven by three-phase (U, V and W) driving currents supplied from the ECU 23. The EPS actuator 22 reduces the speed of rotation of the motor 21, and then transmits the rotation with the reduced speed to the column shaft 8, thereby applying the motor torque to the steering system as assist force.

A torque sensor 27 and a vehicle speed sensor 28 are connected to the ECU 23. The torque sensor 27 detects a steering torque T. The vehicle speed sensor 28 detects a vehicle speed SPD. Then, the ECU 23 calculates a target assist force based on the steering torque T and the vehicle speed SPD, and supplies driving electric current to the motor 21 to generate a motor torque corresponding to the target assist force, thereby controlling the operation of the EPS actuator 22.

Figure 2:
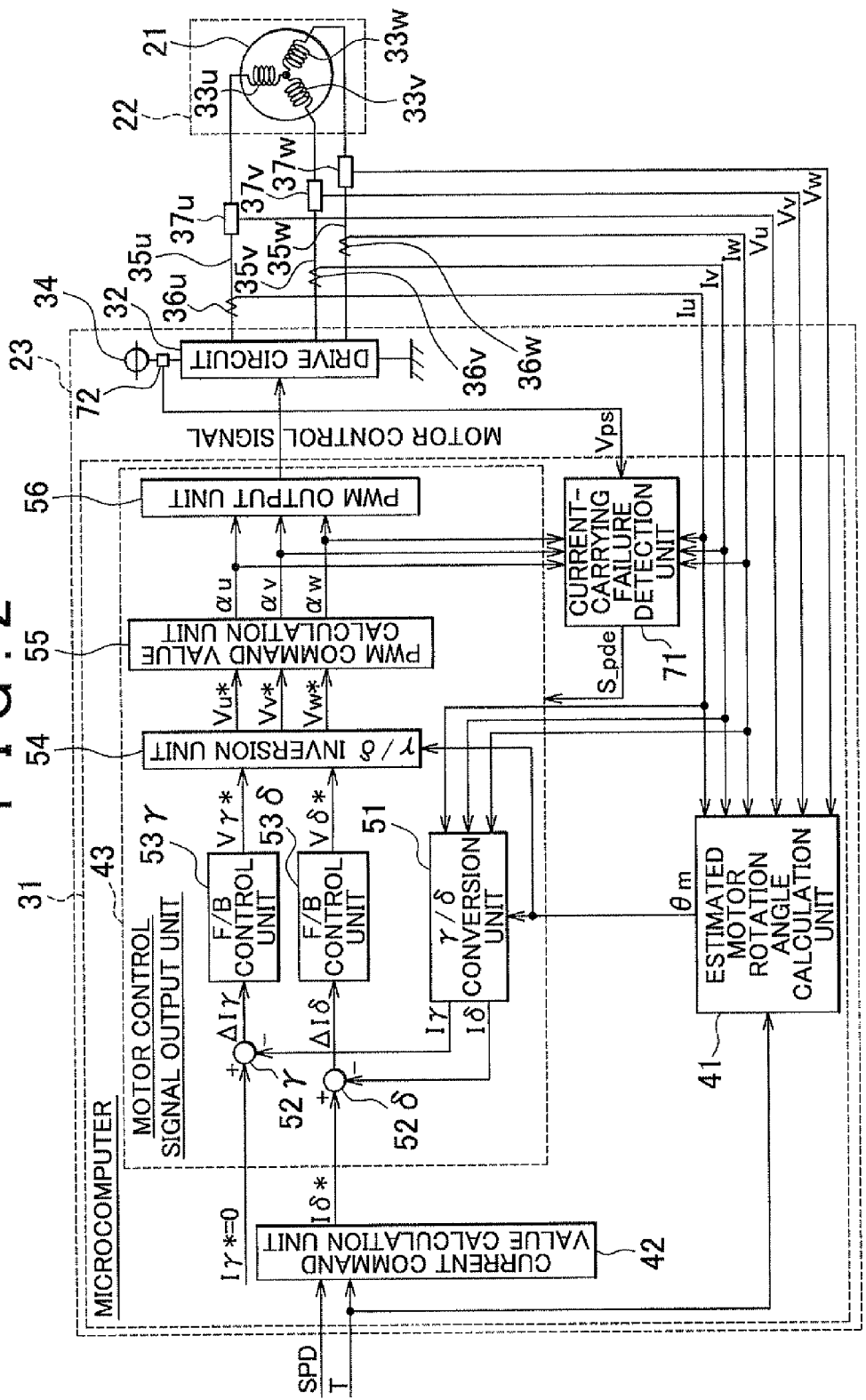
FIG. 2 is a control block diagram of an electronic control unit (ECU)

Next, the electrical configuration of the EPS 1 according to the first embodiment will be described. As shown in FIG. 2, the ECU 23 includes a microcomputer 31 and a drive circuit 32. The microcomputer 31 serves as a motor control signal output unit that outputs motor control signals. The drive circuit 32 supplies three-phase driving currents to the motor 21 based on the motor control signals output from the microcomputer 31. Control blocks described below are implemented according to computer programs executed by the microcomputer 31. The microcomputer 31 detects state quantities in a predetermined sampling period, and executes calculation processes shown in the following control blocks in a predetermined calculation period, thereby outputting the motor control signals.

A known PWM inverter is employed as the drive circuit 32. The PWM inverter is formed as follows. A pair of switching elements connected in series with each other is used as a base unit (switching arm). Three switching arms corresponding to motor coils 33$u$, 33$v$ and 33$w$ of the respective phases are connected in parallel with one another to form the PWM inverter. The motor control signals output from the microcomputer 31 define the on/off states of the respective phase switching elements that constitute the drive circuit 32 (the on duty ratios of the respective switching arms). The drive circuit 32 operates in response to reception of the motor control signals, and supplies three-phase driving currents based on the voltage (power supply voltage Vps) of an in-vehicle power supply 34 to the motor 21.

In addition, the ECU 23 is provided with current sensors 36$u$, 36$v$ and 36$w$, and voltage sensors 37$u$, 37$v$ and 37$w$ that are arranged at intermediate portions of power lines 35$u$, 35$v$ and 35$w$ that connect the drive circuit 32 (switching arms) to the respective phase motor coils 33$u$, 33$v$ and 33$w$. The microcomputer 31 includes an estimated motor rotation angle calculation unit 41 that serves as an estimated motor rotation angle calculator that calculates an estimated motor rotation angle $\theta m$ based on phase current values Iu, Iv and Iw respectively detected by the current sensors 36$u$, 36$v$ and 36$w$, and phase voltage values Vu, Vv and Vw respectively detected by the voltage sensors 37$u$, 37$v$ and 37$w$. The microcomputer 31 does not use a rotation angle sensor to detect a motor rotation angle, but drives the motor 21 based on an estimated motor rotation angle $\theta m$ calculated by the estimated motor rotation angle calculation unit 41 to control the motor 21.

The microcomputer 31 includes a current command value calculation unit 42, and a motor control signal output unit 43. The current command value calculation unit 42 calculates a target value of electric power that is supplied to the motor 21, that is, a current command value ($\delta$-axis current command value I$\delta$*) that corresponds to a target assist force. The motor control signal output unit 43 outputs motor control signals based on the current command value.

The steering torque T and the vehicle speed SPD are input into the current command value calculation unit 42. The current command value calculation unit 42 calculates, as a current command value, the δ-axis current command value Iδ* in a two-phase rotating coordinate system (γ/δ coordinate system) according to the estimated motor rotation angle θm based on the steering torque T and the vehicle speed SPD. Specifically, the current command value calculation unit 42 calculates the δ-axis current command value Iδ* having a larger absolute value, as the absolute value of the steering torque T is larger or as the vehicle speed SPD is lower. In addition, a γ-axis current command value Iγ* is fixed at zero (Iγ*=0). The γ/δ coordinate system is a coordinate system that rotates together with a rotor (not shown), and is defined by a γ axis that extends along the direction of magnetic flux generated by a field magnet (magnet) provided at the rotor, and a δ axis perpendicular to the γ axis.

The phase current values Iu, Iv and Iw and the estimated motor rotation angle θm are input into the motor control signal output unit 43 together with the δ-axis current command value Iδ* calculated by the current command value calculation unit 42. The motor control signal output unit 43 executes feedback control over currents in the γ/δ coordinate system based on these state quantities, thereby generating motor control signals.

Specifically, the phase current values Iu, Iv and Iw input into the motor control signal output unit 43 are input into a γ/δ conversion unit 51. The γ/δ conversion unit 51 maps the phase current values Iu, Iv and Iw onto the γ/δ coordinate system based on the estimated motor rotation angle θm, thereby calculating a γ-axis current value Iγ and a δ-axis current value Iδ. The δ-axis current value Iδ is input into a subtracter 52δ together with the γ-axis current command value Iδ* output from the current command value calculation unit 42. The δ-axis current value Iγ is input into a subtracter 52γ together with the γ-axis current command value Iγ*. The subtracters 52γ and 52δ respectively calculate a γ-axis current deviation ΔIγ and a δ-axis current deviation ΔIδ.

The γ-axis current deviation ΔIγ and the δ-axis current deviation ΔIδ are input into a F/B control unit 53γ and a F/B control unit 53δ, respectively. Then, the F/B control units 53γ and 53δ execute feedback calculation so as to cause the γ-axis current value Iγ* and the δ-axis current value Iδ to respectively follow the γ-axis current command value Iγ* and the δ-axis current command value Iδ*, thereby calculating a δ-axis voltage command value Vγ* and a δ-axis voltage command value Vδ* that are the voltage command values in the γ/δ coordinate system. More specifically, the F/B control units 53γ and 53δ calculate proportional components obtained by multiplying the δ-axis current deviation ΔIγ and the δ-axis current deviation ΔIδ by proportional gains, respectively, and integral components obtained by multiplying the integral values of the γ-axis current deviation ΔIγ and the δ-axis current deviation ΔIε by integral gains, respectively. Then, the proportional component and integral component for the γ-axis are added together to calculate a γ-axis voltage command value Vγ*, and the proportional component and integral component for the δ-axis are added together to calculate a δ-axis voltage command value Vδ*.

The γ-axis voltage command value Vγ* and the δ-axis voltage command value Vδ* are input into a γ/δ inversion unit 54 together with the estimated motor rotation angle θm. The γ/δ inversion unit 54 maps the γ-axis voltage command value Vγ* and the δ-axis voltage command value Vδ* onto three-phase alternating current coordinates based on the estimated motor rotation angle θm, thereby calculating three-phase phase voltage command values Vu*, Vv* and Vw*. The phase voltage command values Vu*, Vv* and Vw* are input into a PWM command value calculation unit 55. The PWM command value calculation unit 55 calculates duty command values αu, αv and αw of the respective phases based on these phase voltage command values Vu*, Vv* and Vw*. Then, a PWM output unit 56 generates motor control signals respectively having on duty ratios indicated by the duty command values αu, αv and αw output from the PWM command value calculation unit 55, and outputs the motor control signals to the drive circuit 32. Thus, driving currents corresponding to the motor control signals are output to the motor 21, and a motor torque corresponding to the driving currents is applied to the steering system as assist force.

Next, calculation of the estimated motor rotation angle will be described. The steering torque T, the phase current values Iu, Iv and Iw and the phase voltage values Vu, Vv and Vw are input into the estimated motor rotation angle calculation unit 41. Then, the estimated motor rotation angle calculation unit 41 calculates an amount of change Δθm (hereinafter, referred to as "change amount Δθm") in the motor rotation angle at each calculation period based on the state quantities, and accumulates the change amounts Δθm, thereby calculating the estimated motor rotation angle θm.

Figure 3:
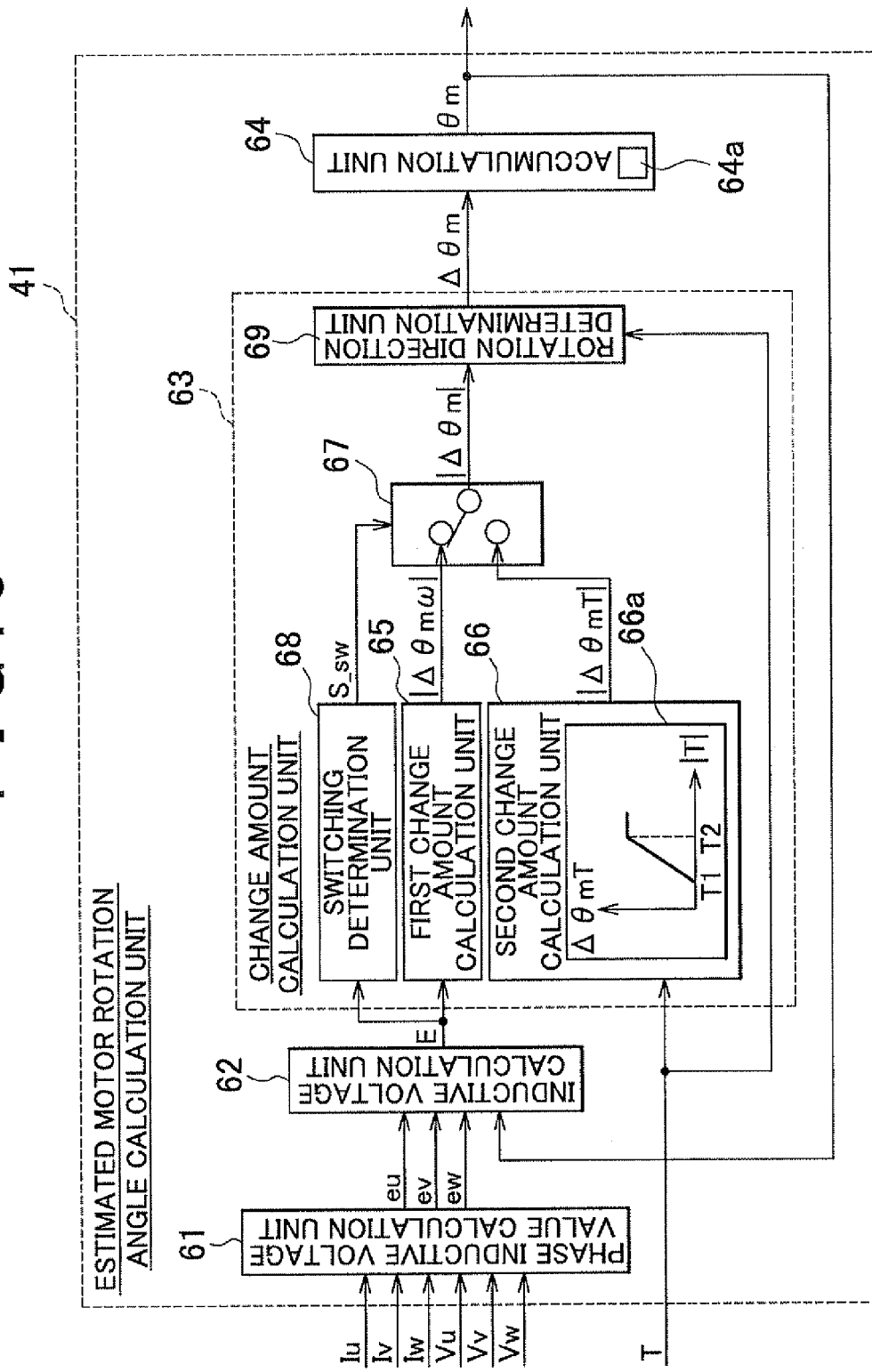
FIG. 3 is a control block diagram of an estimated motor rotation angle calculation unit.

More specifically, as shown in FIG. 3, the phase current values Iu, Iv and Iw and the phase voltage values Vu, Vv and Vw input into the estimated motor rotation angle calculation unit 41 are input into a phase inductive voltage value calculation unit 61. Then, phase inductive voltage values eu, ev and ew are calculated in the phase inductive voltage value calculation unit 61. The phase inductive voltage value calculation unit 61 estimates the phase inductive voltage values eu, ev and ew based on the phase current values Iu, Iv and Iw and the phase voltage values Vu, Vv and Vw according to Equations 1 to 3 indicated below.

$$eu = Vu - Iu \cdot Ru \quad \text{Equation 1}$$

$$ev = Vv - Iv \cdot Rv \quad \text{Equation 2}$$

$$ew = Vw - Iw \cdot Rw \quad \text{Equation 3}$$

Equations 1 to 3 are known motor voltage equations, and "Ru", "Rv" and "Rw" respectively indicate the resistance values of the motor coils 33u, 33v and 33w of the respective phases.

The phase inductive voltage values eu, ev and ew calculated in the phase inductive voltage value calculation unit 61 are input into an inductive voltage value calculation unit 62. The inductive voltage value calculation unit 62 converts the phase inductive voltage values eu, ev and ew in the three-phase alternating current coordinate system into phase inductive voltage values eγ and eδ in the γ/δ coordinate system, and calculates an inductive voltage value E that is generated in the motor 21 according to Equation 4 indicated below. The inductive voltage value calculation unit 62 converts the phase inductive voltage values eu, ev and ew into the phase inductive voltage values eγ and eδ, using the estimated motor rotation angle θm calculated by an accumulation unit 64 (described later) in the immediately preceding calculation period.

$$E = \sqrt{(e\gamma^2 + e\delta^2)} \quad \text{Equation 4}$$

The inductive voltage value E calculated in the inductive voltage value calculation unit 62 is input into a change amount calculation unit 63 that calculates a change amount Δθm in motor rotation angle in each calculation period. The change amount calculation unit 63 includes a first change amount calculation unit 65 and a second change amount calculation unit 66. The first change amount calculation unit 65 calculates the absolute value of a first change amount Δθmω based on the inductive voltage value E. The second change amount calculation unit 66 calculates the absolute value of a second change amount ΔθmT based on the steering torque T, When the absolute value of the inductive voltage value E is larger than a predetermined inductive voltage value Eth, the change amount calculation unit 63 outputs the change amount Δθm based on the first change amount Δθmω, calculated by the first change amount calculation unit 65, to the accumulation unit 64. On the other hand, when the absolute value of the inductive voltage value E is smaller than or equal to the predetermined inductive voltage value Eth, the change amount calculation unit 63 outputs the change amount Δθm based on the second change amount ΔθmT, calculated by the second change amount calculation unit 66, to the accumulation unit 64. In consideration of the fact that the inductive voltage value E increases and is more stabilized as the rotation angular velocity of the motor 21 increases, the predetermined inductive voltage value Eth is set at such a value that the inductive voltage value E is stabilized and the accuracy of the change amount Δθm based on the inductive voltage is ensured.

Specifically, the first change amount calculation unit 65 calculates the estimated motor rotation angular velocity ωm of the motor 21 according to Equation 5.

$$\omega m = E/Ke \qquad \text{Equation 5}$$

In Equation 5, "Ke" is an inductive voltage constant (counter electromotive constant). The first change amount calculation unit 65 calculates the first change amount Δθmω in each calculation period by multiplying the estimated motor rotation angular velocity ωm by the calculation period, and outputs the absolute value of the first change amount Δθmω to a switching control unit 67.

The second change amount calculation unit 66 has a map 66a that indicates the correlation between the steering torque T and the second change amount ΔθmT. The second change amount calculation unit 66 calculates the second change amount ΔθmT with reference to the map 66a, and outputs the absolute value of the second change amount ΔθmT to the switching control unit 67. The map 66a is set such that the second change amount ΔθmT is zero in a region in which the absolute value of the steering torque T is smaller than or equal to a predetermined first torque T1. In a region in which the absolute value of the steering torque T is larger than the first torque T1 and is smaller than or equal to a second torque T2, the second change amount ΔθmT is set to increase in proportion to an increase in the absolute value of the steering torque T; and, in a region in which the absolute value of the steering torque T is larger than the second torque T2, the second change amount ΔθmT is set at a constant value.

The change amount calculation unit 63 includes a switching determination unit 68. The switching determination unit 68 determines which one of the first change amount Δθmω and the second change amount ΔθmT input into the switching control unit 67 is output based on the inductive voltage value E calculated in the inductive voltage value calculation unit 62. The switching determination unit 68 determines whether the inductive voltage value E is larger than the predetermined inductive voltage value Eth. When the inductive voltage value E is larger than the predetermined inductive voltage value Eth, the switching determination unit 68 outputs a determination signal S_sw, indicating that the first change amount Δθmω should be output, to the switching control unit 67. On the other hand, when the inductive voltage value E is smaller than or equal to the predetermined inductive voltage value Eth, the switching determination unit 68 outputs a determination signal S_sw, indicating that the second change amount ΔθmT should be output, to the switching control unit 67.

Then, the switching control unit 67 outputs the absolute value of the first change amount Δθmω or the absolute value of the second change amount ΔθmT, depending on the determination signal S_sw, as the absolute value of the change amount Δθm, to a rotation direction determination unit 69. The rotation direction determination unit 69 determines the sign of the change amount Δθm based on the sign (direction) of the steering torque T detected by the torque sensor 27 on the condition that the motor 21 rotates in accordance with the rotation of the steering wheel 2 and the steering wheel 2 rotates in the direction of the steering torque T.

Subsequently, the change amount Δθm calculated in the change amount calculation unit 63 is input into the accumulation unit 64 that accumulates the change amounts Δθm. The accumulation unit 64 has a memory 64a that stores a value of the estimated motor rotation angle θm in the immediately preceding calculation period. The accumulation unit 64 adds (adds or subtracts based on the sign of the change amount Δθm) the change amount Δθm to the estimated motor rotation angle θm in the immediately preceding calculation period, which is stored in the memory 64a, to calculate the estimated motor rotation angle θm. Then, the accumulation unit 64 outputs the calculated estimated motor rotation angle θm to the γ/δ conversion unit 51, the γ/δ inversion unit 54 (see FIG. 2), and the inductive voltage value calculation unit 62.

At the time of turning on an ignition (at the time of start-up), a given value (for example, "0") is used as the initial value of the estimated motor rotation angle θm, and, after the motor 21 starts rotating, the estimated motor rotation angle θm is corrected so as to approach an actual motor rotation angle based on, for example, the inductive voltage.

Figure 4:
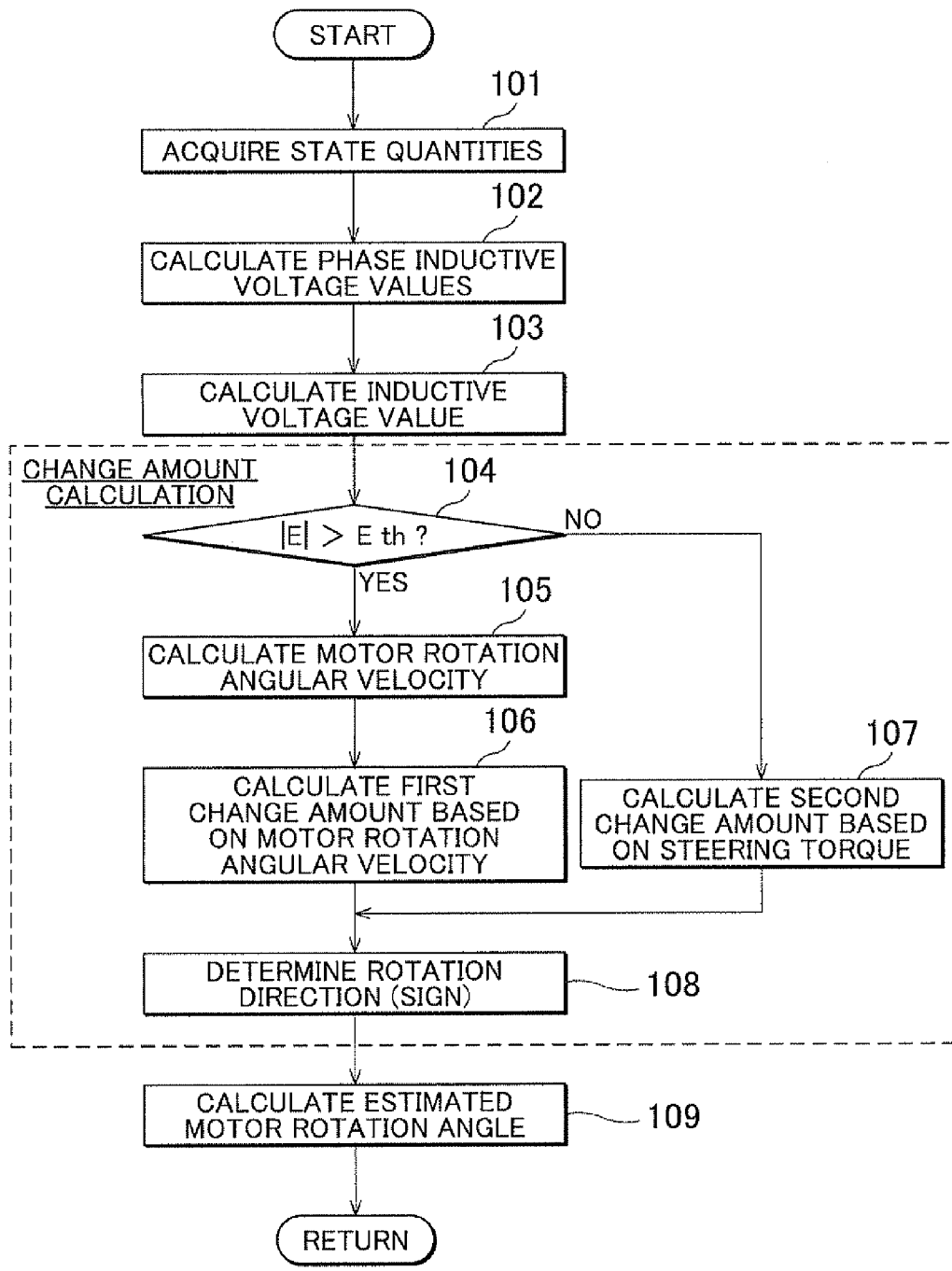
FIG. 4 is a flowchart that shows the procedure of estimated motor rotation angle calculation executed by the estimated motor rotation angle calculation unit.

That is, as shown in the flowchart of FIG. 4, when the estimated motor rotation angle calculation unit 41 acquires the steering torque T, the phase current values Iu, Iv and Iw and the phase voltage values Vu, Vv and Vw (step 101), the estimated motor rotation angle calculation unit 41 calculates the phase inductive voltage values eu, ev and ew according to Equations 1 to 3 indicated above (step 102). Subsequently, the estimated motor rotation angle calculation unit 41 calculates the inductive voltage value E based on the phase inductive voltage values eu, ev and ew (step 103). Then, in step 104 to step 108, the change amount Δθm in the motor rotation angle is calculated based on the inductive voltage value E and the steering torque T.

Specifically, the estimated motor rotation angle calculation unit 41 determines whether the absolute value of the inductive voltage value E is larger than the predetermined inductive voltage value Eth (step 104). When the absolute value of the inductive voltage value E is larger than the predetermined inductive voltage value Eth (YES in step 104), the estimated motor rotation angular velocity ωm is calculated according to Equation 5 indicated above (step 105), and the absolute value of the first change amount Δθmω (change amount Δθm) is calculated based on the estimated motor rotation angular velocity ωm (step 106). On the other hand, when the absolute value of the inductive voltage value E is smaller than or equal to the predetermined inductive voltage value Eth (NO in step 104), the absolute value of the second change amount ΔΓmT (change amount Δθm) is calculated based on the steering torque T with reference to the map 66a (step 107). Subsequently, the sign of the change amount Δθm calculated in step 106 or step 107 is determined based on the sign of the steering torque T (step 108). Then, the estimated motor rotation angle calculation unit 41 accumulates the change amounts Δθm to calculate the estimated motor rotation angle θm (step 109).

Next, current-carrying failure detection executed by the ECU according to the first embodiment will be described. As shown in FIG. 2, the microcomputer 31 includes a current-carrying failure detection unit 71 that serves as an abnormality detection unit. The current-carrying failure detection unit 71 detects a current-carrying failure in the electric power supply path through which driving current is supplied to the motor 21. The types of current-carrying failures include, for example, a wire disconnection of at least one of the power lines 35u, 35v and 35w, and an open failure (open stuck failure) of at least one of the switching elements that constitute the drive circuit 32. If a current-carrying failure occurs, current does not flow through at least one of the phases.

The phase current values Iu, Iv and Iw and the duty command values αu, αv and αw are input into the current-carrying failure detection unit 71. The phase current values Iu, Iv and Iw are actual current values respectively detected by the current sensors 36u, 36v and 36w. The duty command values αu, αv and αw are internal command values corresponding to the phase voltage command values Vu*, Vv* and Vw* used at the time of generating motor control signals. In addition, the ECU 23 includes a voltage sensor 72 that detects the power supply voltage Vps of the in-vehicle power supply 34. The power supply voltage Vps detected by the voltage sensor 72 is input into the current-carrying failure detection unit 71. Then, the current-carrying failure detection unit 71 determines whether a current-carrying failure has occurred in the electric power supply paths of the respective phases based on the state quantities, and outputs a current-carrying failure detection signal S_pde, indicating the determination result, to the motor control signal output unit 43. In the first embodiment, the current-carrying failure detection unit 71 simultaneously executes current-carrying failure detections for respective phases in parallel with one another at the same time. When the current-carrying failure detection signal S de that indicates that a current-carrying failure has occurred is input into the motor control signal output unit 43, the motor control signal output unit 43 outputs motor control signals that indicate that the motor 21 should be stopped, thereby promptly performing the fail-safe function.

The current-carrying failure detection is executed in the following manner. First, an attempt to apply electric current to the motor 21 is made. Then, if a detected actual current value indicates a non-current carrying state despite the attempt to apply electric current to the motor 21, it is determined that a current-carrying failure has occurred. If the motor rotation angular velocity is added to the determination conditions as described above, it is possible to prevent occurrence of a situation where the state in which current cannot be applied to the motor 21 under the influence of inductive voltage is erroneously determined as a current-carrying failure. Because the ECU 23 has no rotation angle sensor, the motor rotation angular velocity is estimated according to Equations 1 to 5 indicated above. However, if a current-carrying failure occurs in one of the phases of the motor 21, a corresponding one of "Ru", "Rv" and "Rw" in Equations 1 to 3 becomes infinite. Therefore, it is not possible to calculate appropriate phase inductive voltage values eu, ev and ew c, and, consequently, it is not possible to estimate the motor rotation angular velocity. That is, in the first embodiment, it is difficult to accurately detect a current-carrying failure using the motor rotation angular velocity.

Under normal conditions where no current-carrying failure has occurred, each duty command value αx that serves as a voltage parameter corresponding to a voltage applied to the motor 21 changes sinusoidally in accordance with the motor rotation angle. When the motor rotation angular velocity is low, the cycle of change in the duty command value αx is long; whereas, when the motor rotation angular velocity is high, the cycle of change in the duty command value αx is short. Here, "X" indicates any one of the three phases U, V and W, and αx indicates the "X"-phase duty command value. As the motor rotation angular velocity increases, the inductive voltage also increases. Therefore, the maximum value of the absolute value of the duty command value αx issued to each phase increases through feedback control.

Under normal conditions where no current-carrying failure has occurred, when the phase current value Ix is smaller than or equal to a predetermined current value Ith and the power supply voltage Vps is higher than or equal to a predetermined power supply voltage value Vth, the duty command value αx corresponding to each phase may be larger than or equal to the upper limit α_hi of a predetermined range corresponding to the predetermined current value Ith or smaller than or equal to the lower limit α_lo of the predetermined range under the influence of inductive voltage. In this case, the duration of the state where the duty command value αx is larger than or equal to the upper limit α_hi of the predetermined range corresponding to the predetermined current value Ith or smaller than or equal to the lower limit α_lo of the predetermined range is determined based on the rotation period of the motor 21.

The predetermined current value Ith is a threshold for determining whether a non-current carrying state has occurred, and is set to be higher than zero in consideration of the detection errors of the current sensors 36u, 36v and 36w. In addition, the predetermined range is a range of the duty command value αx, in which the phase current value Ix is smaller than or equal to the predetermined current value Ith in the state where the motor rotation angular velocity is low and the inductive voltage is not high, and is set in consideration of the influence of detection errors of the current sensors 36u, 36v and 36w. The predetermined power supply voltage value Vth is set at a value derived on the assumption that the power supply voltage Vps is not decreased due to, for example, degradation of the in-vehicle power supply 34 and sufficient voltage is able to be applied to the motor 21.

Figure 5A:
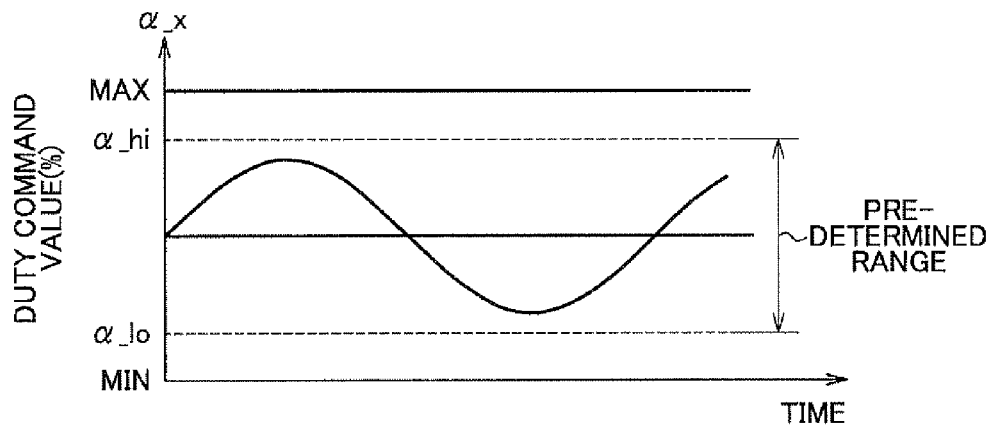
FIG. 5A is a graph that shows a temporal change in a duty command value while a motor is rotating at a low speed under normal conditions where no current-carrying failure has occurred.
Figure 5B:
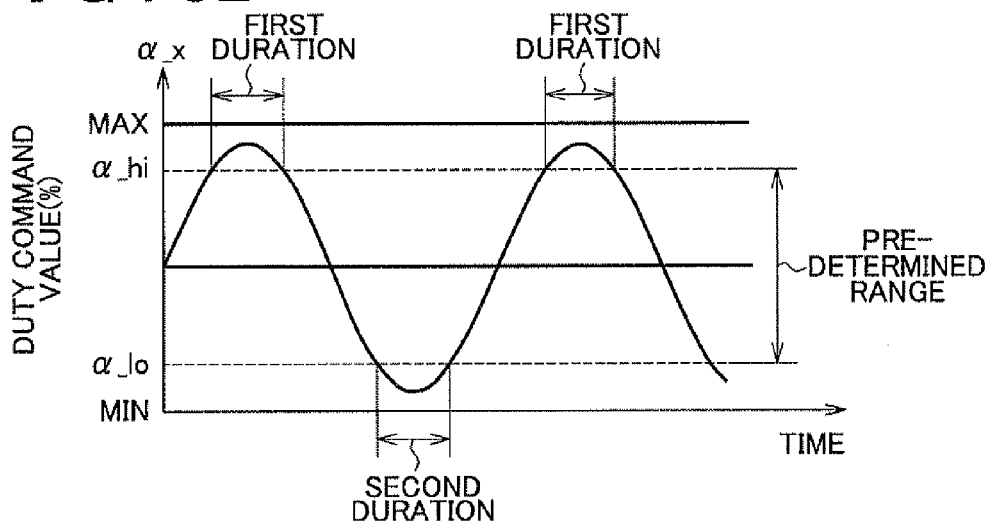
FIG. 5B is a graph that shows a temporal change in a duty command value while the motor is rotating at a high speed under normal conditions where no current-carrying failure has occurred.

For example, as shown in FIG. 5A, under normal conditions where no current-carrying failure has occurred, when the motor rotation angular velocity is low, the cycle of change in the duty command value αx is long. Because the motor rotation angular velocity is low and therefore the inductive voltage is also low, the duty command value αx does not become larger than or equal to the upper limit α_hi, and does not become smaller than or equal to the lower limit α_lo. On the other hand, for example, as shown in FIG. 5B, under normal conditions where the motor rotation angular velocity is high, the inductive voltage increases and, therefore, the duty command value αx becomes larger than or equal to the upper limit α_hi or becomes smaller than or equal to the lower limit α_lo. When the motor 21 is rotating at a motor rotation angular velocity that is higher than or equal to a predetermined angular velocity ωth at which the duty command value αx becomes lager than or equal to the upper limit α_hi or becomes smaller than or equal to the lower limit α_lo (the duty command value αx falls outside the predetermined range) due to the influence of inductive voltage as described above, the cycle of change in the duty command value αx becomes shorter in accordance with the motor rotation angular velocity. The duration of the state where the duty command value αx is larger than or equal to the upper limit α_hi or smaller than or equal to the lower limit α_lo is determined based on the motor rotation period that is proportional to the motor rotation angular velocity or the inverse of the motor rotation angular velocity.

Figure 5C:
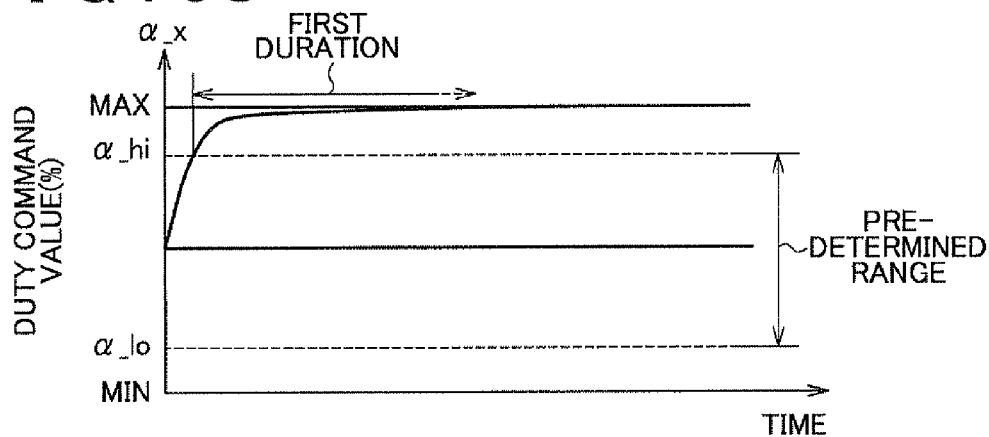
FIG. 5C is a graph that shows a temporal change in a duty command value under abnormal conditions where a current-carrying failure has occurred.

In contrast to this, under abnormal conditions where a current-carrying failure has occurred, for example, as shown in FIG. 5C, the state where the duty command value αx is larger than or equal to the upper limit α_hi or is smaller than or equal to the lower limit α_lo may continue irrespective of the rotation period of the motor 21 that rotates at a motor rotation angular velocity higher than or equal to the predetermined angular velocity ωth.

The current-carrying failure detection unit 71 utilizes the above-described phenomenon to determine whether a current-carrying failure has occurred. The current-carrying failure detection unit 71 determines whether a first determination condition is satisfied. The first condition is a condition that the phase current value Ix, which is a target for determination, is smaller than or equal to the predetermined current value Ith, the power supply voltage Vps is higher than or equal to the predetermined power supply voltage value Vth, and the duty command value αx of the corresponding phase is larger than or equal to the upper limit α_hi. In addition, the current-carrying failure detection unit 71 determines whether a second determination condition is satisfied. The second condition is a condition that the phase current value Ix is smaller than or equal to the predetermined current value Ith, the power supply voltage Vps is higher than or equal to the predetermined power supply voltage value Vth, and the duty command value αx of the corresponding phase is smaller than or equal to the lower limit α_lo is. That is, it is determined whether the present state is the state where electric current is not applied to the motor 21 despite the attempt to apply electric current to the motor 21.

In addition, the current-carrying failure detection unit 71 measures the duration of a state where the first determination condition is continuously satisfied (first duration), and the duration of a state where the second determination condition is continuously satisfied (second duration). The current-carrying failure detection unit 71 (microcomputer 31) according to the first embodiment includes upper limit counters for measuring the first duration and lower limit counters for measuring the second duration phase for respective phases. When the first or second duration exceeds a reference period corresponding to the rotation period of the motor 21 during high-speed rotation (when the motor rotation angular velocity is higher than or equal to the predetermined angular velocity ωth), it is determined that a current-carrying failure has occurred.

Under normal conditions where no current-carrying failure has occurred, the period of time during which the duty command value αx continuously satisfies the first or second determination condition due to the influence of inductive voltage is usually shorter than or equal to half of one period in electric angle, even the case is taken into account where the waveform of the duty command value αx becomes a waveform close to a rectangular waveform rather than a sinusoidal waveform under the influence of an error, noise, or the like, that occurs when the estimated motor rotation angle θm is estimated. Therefore, the reference period according to the first embodiment is set to half of one period in electric angle of the motor 21 during high-speed rotation.

Figure 6:
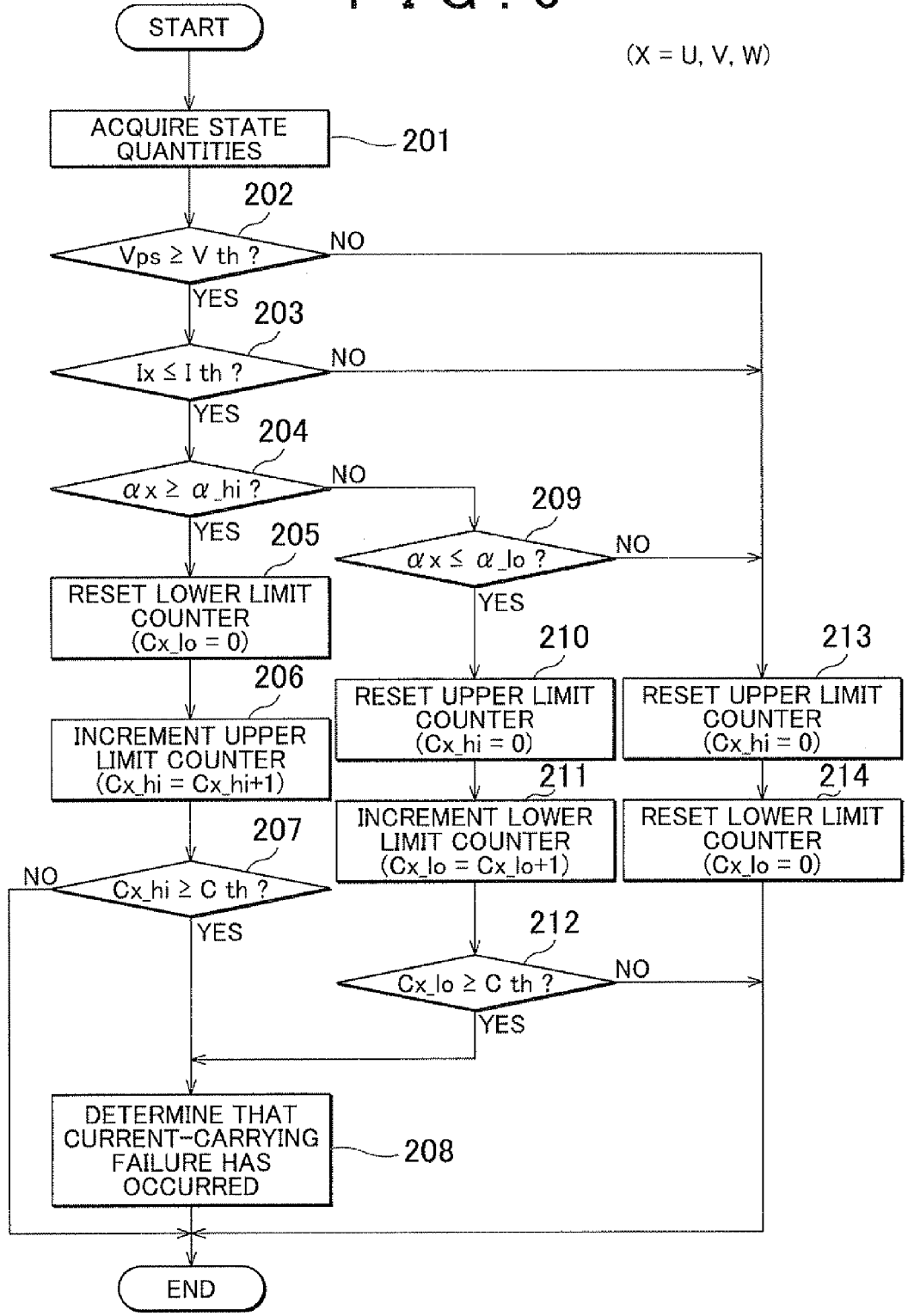
FIG. 6 is a flowchart that shows the procedure of current-carrying failure determination executed by a current-carrying failure detection unit according to a first embodiment.

Next, the procedure of current-carrying failure detection executed by the current-carrying failure detection unit 71 will be described with reference to the flowchart shown in FIG. 6. The procedure of current-carrying failure detection for each phase is the same. Therefore, for the sake of convenience of description, only the procedure of one of the phases will be described below.

The current-carrying failure detection unit 71 acquires the power supply voltage Vps, the phase current value Ix of the phase, which is the target of determination, and the duty command value αx of the determination target phase (step 201), and determines whether the power supply voltage Vps is higher than or equal to the predetermined power supply voltage value Vth (step 202). Subsequently, when the power supply voltage Vps is higher than or equal to the predetermined power supply voltage value Vth (YES in step 202), it is determined whether the phase current value Ix is smaller than or equal to the predetermined current value Ith (step 203). When the phase current value Ix is smaller than or equal to the predetermined current value Ith (YES in step 203), it is determined whether the duty command value αx is larger than or equal to the upper limit α_hi (step 204).

Subsequently, when the duty command value αx is larger than or equal to the upper limit α_hi (YES in step 204), the current-carrying failure detection unit 71 resets the counter value Cx_lo of the lower limit counter of the determination target phase to zero (step 205: Cx_lo=0), and increments, by one, the counter value Cx_hi of the upper limit counter of the determination target phase (step 206: Cx_hi=Cx_hi+1). At the time of turning on the ignition, the counter value Cx_hi of the upper limit counter and the counter value Cx_lo of the lower limit counter each are set at zero. Then, it is determined whether the counter value Cx_hi of the upper limit counter is larger than or equal to a predetermined counter value Cth that indicates the reference period (step 207). When the counter value Cx_hi is larger than or equal to the predetermined counter value Cth (YES in step 207), it is determined that a current-carrying failure has occurred in the determination target phase (step 208). On the other hand, when the counter value Cx_hi of the upper limit counter is smaller than the predetermined counter value Cth (NO in step 207), it is determined that no current-carrying failure has occurred.

On the other hand, when the duty command value αx is smaller than the α_hi (NO in step 204), the current-carrying failure detection unit 71 determines whether the duty command value αx is smaller than or equal to the α_lo (step 209). Subsequently, when the duty command value αx is smaller than or equal to the lower limit α_lo (YES in step 209), the upper limit counter is reset to zero (step 210: Cx_hi=0), and the lower limit counter is incremented by one (step 211: Cx_lo=Cx_lo+1). Then, it is determined whether the counter value Cx_lo of the lower limit counter is larger than or equal to the predetermined counter value Cth (step 212). When the counter value Cx_lo is larger than or equal to the predetermined counter value Cth (YES in step 212), the process proceeds to step 208 and it is determined that a current-carrying failure has occurred in the determination target phase. On the other hand, when the counter value Cx_lo of the lower limit counter is smaller than the predetermined counter value Cth (NO in step 212), it is determined that no current-carrying failure has occurred.

When the power supply voltage Vps is lower than the predetermined power supply voltage value Vth (NO in step 202) or when the phase current value Ix is larger than the predetermined current value Ith (NO in step 203), the counter value Cx_hi of the upper limit counter and the counter value Cx_lo of the lower limit counter each are reset to zero (step 213: Cx_hi=0, step 214: Cx_lo=0). In addition, when the duty command value αx is larger than the lower limit α_lo (NO in step 209), that is, when the duty command value αx falls within the predetermined range, the process proceeds to step 213 and step 214 to reset each of the counter value Cx_hi of the upper limit counter and the counter value Cx_lo of the lower limit counter to zero.

As described above, according to the first embodiment, the following advantageous effects are obtained.

1) When the phase current value Ix is smaller than or equal to the predetermined current value Ith and the power supply voltage Vps is higher than or equal to the predetermined power supply voltage value Vth, the current-carrying failure detection unit 71 measures the first duration of the state where the duty command value αx is continuously larger than or equal to the upper limit α_hi and the second duration of the state where the duty command value αx is continuously smaller than or equal to the lower limit α_lo. When the first or second duration exceeds the reference period that is set based on the rotation period of the motor 21 during high-speed rotation, it is determined that a current-carrying failure has occurred.

That is, the duration of the state where the first or second determination condition is satisfied due to the influence of inductive voltage corresponds to the rotation period of the motor 21 during high-speed rotation. Therefore, with the above configuration, it is possible to accurately detect a current-carrying failure by preventing an erroneous determination that a current-carrying failure has occurred from being made during high-speed rotation, without adding the motor rotation angular velocity to the determination conditions. Thus, the fail-safe function is promptly performed to suppress a decrease in steering feel.

2) The current-carrying failure detection unit 71 measures the duration of the state where the first determination condition is continuously satisfied as the first duration, and measures the duration of the state where the second determination condition is continuously satisfied as the second duration. Therefore, the first and second durations are easily measured.

Next, a second embodiment of the invention will be described with reference to the accompanying drawings. The second embodiment differs from the first embodiment only in current-carrying failure detection method. Therefore, for the sake of convenience of description, the same components as those in the first embodiment will be denoted by the same reference numerals as those in the first embodiment, and the description thereof will be omitted.

As shown in FIG. 7A, for example, even when the first determination condition is satisfied due to occurrence of a current-carrying failure, the duty command value αx may instantaneously become smaller than the upper limit α_hi due to the influence of noise. Therefore, when the duration of the state where the first determination condition is continuously satisfied is used as the first duration and the duration of the state where the second determination condition is continuously satisfied is used as the second duration, a situation may occur where the durations become short and therefore a current-carrying failure is not detected.

When no current-carrying failure has occurred, the duration of the state where the first or second determination condition is satisfied within a given measuring period longer than or equal to one period in electric angle of the motor 21 during high-speed rotation is usually shorter than two-thirds of the measuring period, As shown in FIG. 7B, for example, in the case where the duty command value Δx changes with a substantially rectangular waveform due to the influence of, for example, an estimation error of the estimated motor rotation angle θm or noise, the first duration becomes longest within the measuring period when the duty command value αx becomes larger than or equal to the upper limit α_hi immediately after the start of measuring period and the duty command value αx changes by an amount corresponding to the change of 1.5 periods within the measuring period. In this case, the accumulated time of the state where the first determination condition is satisfied is substantially two-thirds of the measuring period. For example, when the duty command value αx changes by an amount corresponding to the change of 2.5 periods within the measuring period, the accumulated time of the state where the first determination condition is satisfied is substantially three-fifths of the measuring period. In this way, even when the duty command value αx changes by an amount larger than the change of 1.5 periods, the ratio of the accumulated time of the state where the first or second determination condition is satisfied to the measuring period is smaller than two-thirds.

On the basis of this point, in the second embodiment, the current-carrying failure detection unit 71 measures the accumulated time during which the first or second determination condition is satisfied within the measuring period, as the first or second duration. In the second embodiment, the measuring period is set to be substantially equal to one period in electric angle of the motor 21 during high-speed rotation, and the reference period is set to two-thirds of the measuring period. The current-carrying failure detection unit 71 determines that a current-carrying failure has occurred when the first or second duration exceeds the reference period. The current-carrying failure detection unit 71 includes a timer for measuring the measuring period.

Next, the procedure of current-carrying failure detection executed by the current-carrying failure detection unit 71 according to the second embodiment will be described with reference to the flowchart shown in FIG. 8. The current-carrying failure detection unit 71 acquires the power supply voltage Vps, the phase current value Ix of the determination target phase and the duty command value αx of the determination target phase (step 301). When the power supply voltage Vps is higher than or equal to the predetermined power supply voltage value Vth (YES in step 302) and the phase current value Ix is smaller than or equal to the predetermined current value Ith (YES in step 303), the current-carrying failure detection unit 71 determines whether the timer value t of the timer is smaller than or equal to a predetermined timer value tth that indicates the measuring period (step 304). At the time of turning on the ignition, the timer value t is set at zero. Subsequently, when the timer value t is smaller than or equal to the predetermined timer value tth (YES in step 304), the timer is incremented by one (step 305: t=t+1), and it is determined whether the duty command value αx is larger than or equal to the upper limit α_hi (step 306).

Subsequently, when the duty command value αx is larger than or equal to the upper limit α_hi (YES in step 306), the current-carrying failure detection unit 71 increments the upper limit counter of the determination target phase by one (step 307: Cx_hi=Cx_hi+1), and determines whether the counter value Cx_hi of the upper limit counter is larger than or equal to the predetermined counter value Cth (step 308). When the counter value Cx_hi of the upper limit counter is larger than or equal to the predetermined counter value Cth (YES in step 308), it is determined that a current-carrying failure has occurred in the determination target phase (step 309). On the other hand, when the counter value Cx_hi of the upper limit counter is smaller than the predetermined counter value Cth (NO in step 308), it is determined that no current-carrying failure has occurred.

On the other hand, when the duty command value αx is smaller than the upper limit α_hi (NO in step 306), the current-carrying failure detection unit 71 determines whether the duty command value αx is lower than or equal to the lower limit α_lo (step 310). When the duty command value αx is lower than or equal to the lower limit α_lo (YES in step 310), the counter value Cx_lo of the lower limit counter of the determination target phase is incremented by one (step 311: CX_lo=CX_lo=1). Then, it is determined whether the counter value Cx_lo of the lower limit counter is larger than or equal to the predetermined counter value Cth (step 312). When the counter value Cx_lo is larger than or equal to the predetermined counter value Cth (YES in step 312), the process proceeds to step 309 and it is determined that a current-carrying failure has occurred in the determination target phase. On the other hand, when the counter value Cx_lo of the lower limit counter is smaller than the predetermined counter value Cth (NO in step 312), it is determined that no current-carrying failure has occurred.

When the power supply voltage Vps is lower than the predetermined power supply voltage value Vth (NO in step 302) or when the phase current value Ix is larger than the predetermined current value Ith (NO in step 303), the upper limit counter and the lower limit counter each are reset to zero (step 313: Cx_hi=0, step 314: Cx_lo=0), and the timer is reset (step 315: t=0). When the timer value t is larger than the predetermined timer value tth (NO in step 304), the process proceeds to steps 313 to 315 and then the upper limit counter, the lower limit counter and the timer are reset. When the duty command value αx is larger than the lower limit α_lo (NO in step 310), that is, when the duty command value αx falls within the predetermined range, the counter values Cx_hi and Cx_lo and the timer value t are maintained without executing the processes in steps 313 to 315.

As described above, according to the second embodiment, in addition to the advantageous effect 1) described in the first embodiment, the following advantageous effect is obtained.

3) The current-carrying failure detection unit 71 measures the accumulated time of the state where the first determination condition is satisfied within the measuring period set to the one period in electric angle of the motor 21 during high-speed rotation as the first duration, and measures the accumulated time of the state where the second determination condition is satisfied within the measuring period as the second duration. When the first or second duration exceeds the reference period set to two-thirds of the measuring period, it is determined that a current-carrying failure has occurred. Therefore, it is possible to further accurately detect a current-carrying failure by reducing the influence of, for example, noise.

The above-described embodiments may be modified into the following alternative embodiments.

In the above-described first embodiment, the microcomputer 31 is provided with the upper limit counters and the lower limit counters for respective phases. That is, six counters in total are provided in the microcomputer 31, However, the invention is not limited to this configuration. The first duration and the second duration may be measured by a single counter and one counter may be provided for each phase. That is, the microcomputer 31 may be provided with three counters in total.

In the above-described first embodiment, the reference period is set to half of one period in electric angle of the motor 21 during high-speed rotation. However, the invention is not limited to this configuration. The reference period may be set to a time that is shorter than or longer than half of one period in electric angle. Similarly, in the above-described second embodiment, the reference period may be set to a period of time shorter than or longer than two-thirds of the measuring period. In addition, the measuring period may be set to a period that is shorter than or longer than one period in electric angle of the motor 21 during high-speed rotation.

In the above-described second embodiment, when the power supply voltage Vps is lower than the predetermined power supply voltage value Vth and the phase current value Ix is smaller than the predetermined current value Ith, the timer is reset. However, the invention is not limited to this configuration. The timer value t may be maintained.

In the above-described embodiments, the duty command values αu, αv and αw are used as voltage parameters corresponding to the voltages applied to the motor 21. However, the invention is not limited to this configuration. For example, the phase voltage command values Vu*, Vv* and Vw*, the phase voltage values Vu, Vv and Vw respectively detected by the voltage sensors 37u, 37v and 37w, or the phase inductive voltage values eu, ev and ew may also be used.

In the above-described embodiments, the condition that the power supply voltage Vps is higher than or equal to the predetermined power supply voltage value. Vth is included in each of the first and second determination conditions. However, the invention is not limited to this configuration. It is not necessary to determine whether the power supply voltage Vps is higher than or equal to the predetermined power supply voltage value Vth.

In the above-described embodiments, the current-carrying failure detection unit 71 simultaneously executes current-carrying failure detections for the three phases in parallel with one another. However, the invention is not limited to this configuration. Current-carrying failure detections for the three phase may be executed sequentially.

In the above-described embodiments, a given value is used as the initial value of the estimated motor rotation angle θm at the start-up. However, the invention is not limited to this configuration. For example, phase fixed current application, in which current is supplied in a predetermined fixed current application pattern at the time of start-up, may be executed, and the motor rotation angle corresponding to the current application pattern may be used as the initial value.

In the above-described embodiments, the invention is applied to the EPS that uses a sensorless motor 21, provided with no rotation angle sensor, as a driving source. However, the invention is not limited to this configuration. The invention may be applied to an EPS 1 that uses a motor provided with a rotation angle sensor as a driving source, and the above-described sensorless control may be executed when the rotation angle sensor is malfunctioning.

In the above-described embodiments, the invention is implemented in the ECU 23 that serves as the motor control unit that controls the motor 21 that is the driving source of the EPS actuator 22. However, the invention is not limited to this configuration. For example, the invention may be implemented in a motor control unit that controls another motor, such as a motor of a variable transmission ratio device that transmits the rotation, obtained by adding the rotation generated by driving the motor to the rotation of an input shaft generated by a steering operation, to an output shaft using a differential mechanism.

What is claimed is:

1. A motor control unit comprising:
   a motor control signal output unit that outputs a motor control signal;
   a drive circuit that supplies driving current to a motor based on the motor control signal; and
   an abnormality detection unit that detects a current-carrying failure in an electric power supply path to the motor based on a voltage parameter corresponding to a voltage that is applied to the motor, wherein
   the abnormality detection unit determines whether a first determination condition is satisfied, the first determination condition including a condition that an actual current value that indicates an electric current actually supplied to the motor is smaller than or equal to a predetermined current value that indicates a non-current carrying state and the voltage parameter is higher than or equal to an upper limit of a predetermined range corresponding to the predetermined current value, and the abnormality detection unit determines whether a second determination condition is satisfied, the second determination condition including a condition that the actual current value is smaller than or equal to the predetermined current value and the voltage parameter is lower than or equal to a lower limit of the predetermined range, the abnormality detection unit measures a first duration that is a duration of time that a state where the first determination condition is satisfied continues, and a second duration that is a duration of time that a state where the second determination condition is satisfied continues, an inductive voltage value calculation unit that determines an inductive voltage value that is generated in the motor, and when the first duration or the second duration exceeds a predetermined reference period that is set based on a rotation period of the motor when the motor is rotating at a high speed that the voltage parameter falls outside the predetermined range due to an influence of inductive voltage, the abnormality detection unit determines that a current-carrying failure has occurred.

2. The motor control unit according to claim 1, wherein the voltage parameter is a duty command value.

3. A vehicle steering system comprising the motor control unit according to claim 1.

4. The motor control unit according to claim 2, wherein the abnormality detection unit measures an accumulated time of a state where the first determination condition is satisfied within a given measuring period as the first duration, and the abnormality detection unit measures an accumulated time of a state where the second determination condition is satisfied within the measuring period as the second duration.

5. A vehicle steering system comprising the motor control unit according to claim 2.

6. The motor control unit according to claim 4, wherein the measuring period is set to be longer than or equal to one period in electric angle of the motor when the motor is rotating at the high speed, and the reference period is set to be longer than or equal to two-thirds of the measuring period.

7. A vehicle steering system comprising the motor control unit according to claim 4.

8. A vehicle steering system comprising the motor control unit according to claim 6.

9. An abnormality detecting method that is applied to a motor control unit that includes a motor control signal output unit that outputs a motor control signal and a drive circuit that supplies driving current to a motor based on the motor control signal, and that is used to detect a current-carrying failure in an electric power supply path to the motor based on a voltage parameter corresponding to a voltage that is applied to the motor, the abnormality detecting method comprising:

determining whether a first determination condition is satisfied, the first determination condition including a condition that an actual current value that indicates an electric current actually supplied to the motor is smaller than or equal to a predetermined current value that indicates a non-current carrying state and the voltage parameter is higher than or equal to an upper limit of a predetermined range corresponding to the predetermined current value, and determining whether a second determination condition is satisfied, the second determination condition including a condition that the actual current value is smaller than or equal to the predetermined current value and the voltage parameter is lower than or equal to a lower limit of the predetermined range, measuring a first duration that is a duration of time that a state where the first determination condition is satisfied continues, and a second duration that is a duration of time that a state where the second determination condition is satisfied continues, determining, via an inductive voltage value calculation unit, an inductive voltage value that is generated in the motor, and determining that a current-carrying failure has occurred when the first duration or the second duration exceeds a predetermined reference period that is set based on a rotation period of the motor when the motor is rotating at a high speed that the voltage parameter falls outside the predetermined range due to an influence of inductive voltage.

* * * * *